(12) United States Patent
Lee

(10) Patent No.: US 11,501,844 B2
(45) Date of Patent: Nov. 15, 2022

(54) MEMORY DEVICE AND TEST METHOD THEREOF

(71) Applicant: SK hynix Inc., Gyeonggi-do (KR)

(72) Inventor: Jeongjun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 114 days.

(21) Appl. No.: 16/912,002

(22) Filed: Jun. 25, 2020

(65) Prior Publication Data

US 2021/0257040 A1  Aug. 19, 2021

(30) Foreign Application Priority Data

Feb. 18, 2020  (KR) .......................... 10-2020-0019663

(51) Int. Cl.
G11C 29/42 (2006.01)
G06F 11/10 (2006.01)
G11C 29/54 (2006.01)

(52) U.S. Cl.
CPC .......... *G11C 29/42* (2013.01); *G06F 11/1068* (2013.01)

(58) Field of Classification Search
None
See application file for complete search history.

(56) References Cited

U.S. PATENT DOCUMENTS

| | | | | |
|---|---|---|---|---|
| 2001/0018729 A1* | 8/2001 | Johnson | ............. | G06F 11/1076 714/E11.034 |
| 2007/0106923 A1* | 5/2007 | Aitken | .................. | G11C 29/16 714/718 |
| 2008/0229169 A1* | 9/2008 | Naritomi | ............. | G06F 11/1032 714/752 |
| 2010/0064181 A1* | 3/2010 | Moyer | ................ | G06F 11/1064 714/48 |
| 2010/0251036 A1* | 9/2010 | Moyer | ................ | G06F 11/1064 714/53 |
| 2011/0258515 A1 | 10/2011 | Earle et al. | | |
| 2012/0192027 A1* | 7/2012 | Tran | .................... | G06F 12/0246 714/752 |
| 2015/0019933 A1* | 1/2015 | Yamazaki | ............. | G06F 11/108 714/758 |

(Continued)

FOREIGN PATENT DOCUMENTS

| | | |
|---|---|---|
| KR | 10-2008-0007806 | 1/2008 |
| KR | 10-2019-0050087 | 5/2019 |

*Primary Examiner* — April Y Blair
*Assistant Examiner* — Dipakkumar B Gandhi
(74) *Attorney, Agent, or Firm* — IP & T Group LLP

(57) ABSTRACT

A memory device adopting an on-chip ECC scheme includes a plurality of banks, each including a normal cell region and a parity cell region; a plurality of parity generation circuits, each generating parity bits for write data to be stored in the normal cell region within a corresponding bank; a test input circuit generating common test bits by comparing the parity bits of the respective banks, and generating individual test bits by comparing bits of the write data with the common test bits; a plurality of write circuits, each writing the write data to the normal cell region within the corresponding bank and writing the individual test bits to the parity cell region within the corresponding bank; and a plurality of test output circuits, each comparing data read from the normal region with the individual test bits read from the parity cell region within a corresponding bank.

16 Claims, 12 Drawing Sheets

(56) References Cited

U.S. PATENT DOCUMENTS

| | | | |
|---|---|---|---|
| 2015/0089327 A1* | 3/2015 | Youn | G11C 29/76 714/768 |
| 2015/0155013 A1* | 6/2015 | Song | G11C 29/1201 365/189.05 |
| 2019/0012229 A1* | 1/2019 | Cha | G11C 29/72 |

* cited by examiner

MEMORY DEVICE AND TEST METHOD THEREOF

CROSS-REFERENCE TO RELATED APPLICATIONS

This application claims priority under 35 U.S.C. § 119 to Korean Patent Application No. 10-2020-0019663, filed on Feb. 18, 2020, the disclosure of which is incorporated herein by reference in its entirety.

BACKGROUND

1. Field

Various embodiments of the present disclosure relate to a semiconductor design technique, and particularly, to a test method of a memory device having an on-chip ECC scheme.

2. Description of the Related Art

As the size of a memory device is reduced, data errors randomly occur, and in particular the occurrence of soft errors is increasing. Therefore, in order to solve this problem, an on-chip ECC scheme in which an ECC function is mounted in the memory device has recently been adopted. That is, in order to secure a yield, the memory device may be repaired by performing a repair operation of replacing memory cells to be repaired with redundancy memory cells or by using the on-chip ECC scheme.

To implement the on-chip ECC scheme, parity bits for ECC may be allocated and stored in a specific space. In particular, in the case of a memory device adopting the on-chip ECC scheme, a method of allocating and storing the parity bits for ECC in some memory regions of a memory array, i.e., parity cell regions) has been proposed.

Also, a memory device generally undergoes a memory device test that measures various characteristics of each memory device, formed on a semiconductor substrate, when all fabrication processes are completed. Through the memory device test, defects in a fabrication process or an assembly process of the semiconductor substrate may be detected so that the throughput of the memory device may be increased. In particular, in a wafer level test in which a memory device in a wafer state is tested during the memory device test, a parallel-bit test (PBT) is performed as a method for reducing the test time. In the PBT, pass and fail may be determined by writing specific test data to all memory cells during a write operation and comparing test data outputted through a global data line during a read operation.

However, in the case of the memory device adopting the on-chip ECC scheme, parity bits for ECC of normal cells are written to the parity cell regions. Thus, it takes a lot of test time to perform a test operation of writing the same test data to normal cell regions and the parity cell regions, and then reading and comparing the written test data again. Accordingly, there is a need for a method capable of efficiently testing the normal cell regions and the parity cell regions. In this context, embodiments of the present invention arise.

SUMMARY

Various embodiments of the present disclosure are directed to a method capable of testing a memory device adopting an on-chip ECC scheme.

In accordance with an embodiment, a memory device may include: a plurality of banks, each including a normal cell region and a parity cell region; a plurality of parity generation circuits, each suitable for generating parity bits for write data to be stored in the normal cell region within a corresponding bank of the plurality of banks; a test input circuit suitable for generating common test bits by comparing the parity bits of the respective banks, and generating individual test bits by comparing bits of the write data with the common test bits; a plurality of write circuits, each suitable for writing the write data to the normal cell region within the corresponding bank and writing the individual test bits to the parity cell region within the corresponding bank; and a plurality of test output circuits, each suitable for comparing data read from the normal region with the individual test bits read from the parity cell region within a corresponding bank.

In accordance with an embodiment, a test method of a memory device may include: generating parity bits for write data to be stored in a normal cell region within each of a plurality of banks; generating common test bits by comparing the parity bits of the respective banks, and generating individual test bits by comparing bits of the write data with the common test bits; writing the write data to the normal cell region and writing the individual test bits to a parity cell region within a corresponding bank; and comparing data read from the normal region with the individual test bits read from the parity cell region within a corresponding bank.

In accordance with an embodiment, a memory device may include: a plurality of banks, each including a normal cell region and a parity cell region; a plurality of parity generation circuits, each suitable for generating parity bits for write data to be stored in the normal cell region within a corresponding bank; a common input circuit suitable for generating common test bits by comparing the parity bits of the respective banks; a plurality of individual input circuits, each suitable for generating individual test bits by comparing bits of the write data with the common test bits; and a plurality of write circuits, each suitable for writing the write data to the normal cell region and writing the individual test bits to the parity cell region within a corresponding bank.

In accordance with an embodiment, a memory device may include: a normal region suitable for storing one or more groups of pattern bits; first and second parity circuits suitable for generating first parity bits and second parity bits, respectively, based on the groups; a common circuit suitable for generating common test bits by comparing the first parity bits with the second parity bits in a bitwise manner; an individual circuit suitable for storing individual test bits in a parity region by comparing the pattern bits with the common test bits; and a test circuit suitable for comparing each group read from the normal region with the individual test bits read from the parity region.

DETAILED DESCRIPTION

Figure 1:
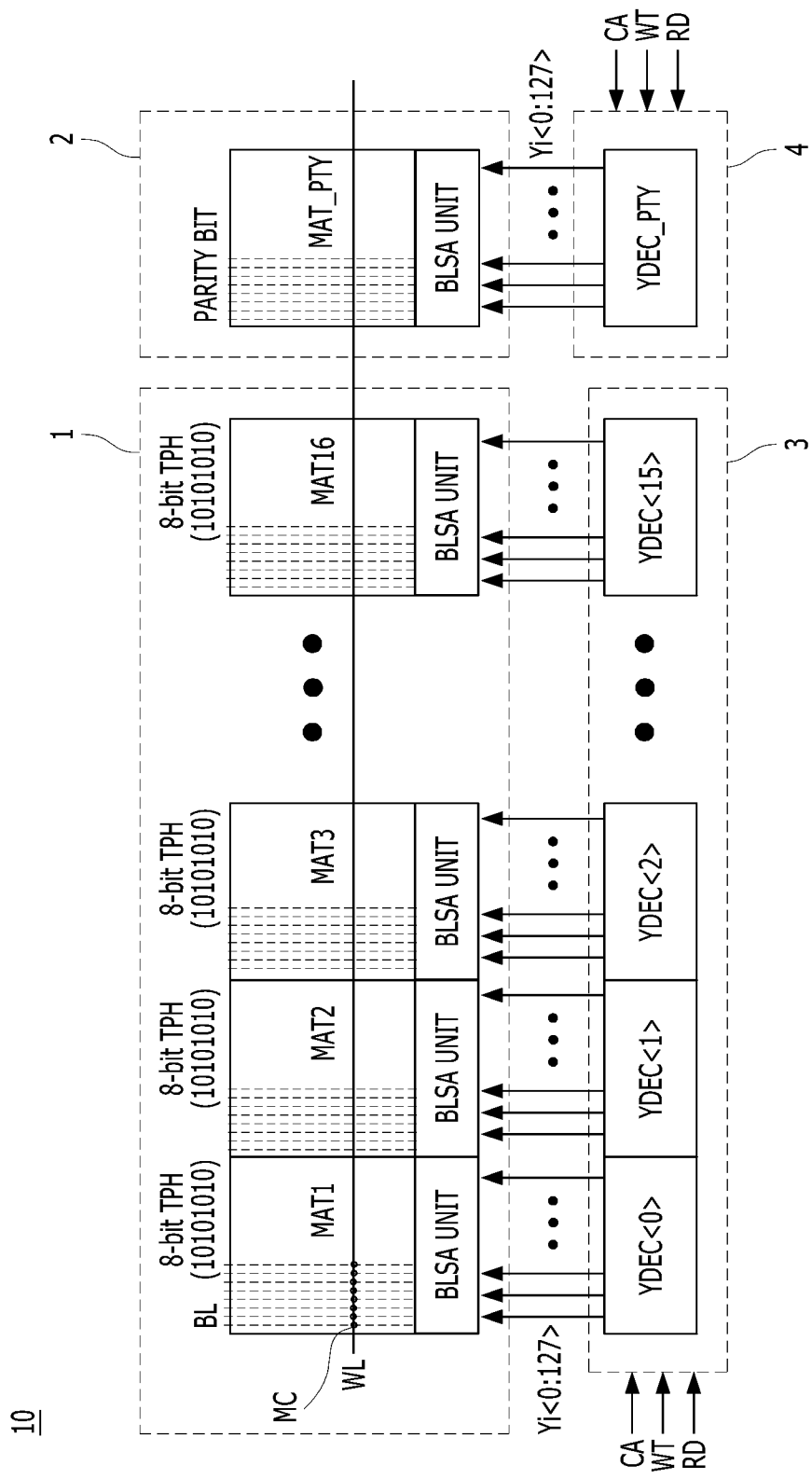
FIGS. 1 and 2 are diagrams illustrating a test operation of a memory device adopting an on-chip ECC scheme.

Various embodiments are described below with reference to the accompanying drawings, in order to describe in detail, the present disclosure to enable those skilled in art to which the present disclosure pertains to practice and easily carry out the present invention. Moreover, in the following description, well-known detail may be omitted. Throughout the disclosure, like reference numerals refer to like parts throughout the various figures and embodiments of the present disclosure. Also, throughout the specification, reference to "an embodiment" or the like is not necessarily to only one embodiment, and different references to any such phrase are not necessarily to the same embodiment(s).

Hereinafter, in the description of the present disclosure, a normal operation of a memory device may include a normal write operation and a normal read operation. A test operation of the memory device may include a test write operation and a test read operation. Also, each of the normal write operation and the test write operation may be defined as a "write operation", and each of the normal read operation and the test read operation may be defined as a "read operation".

Figure 2:
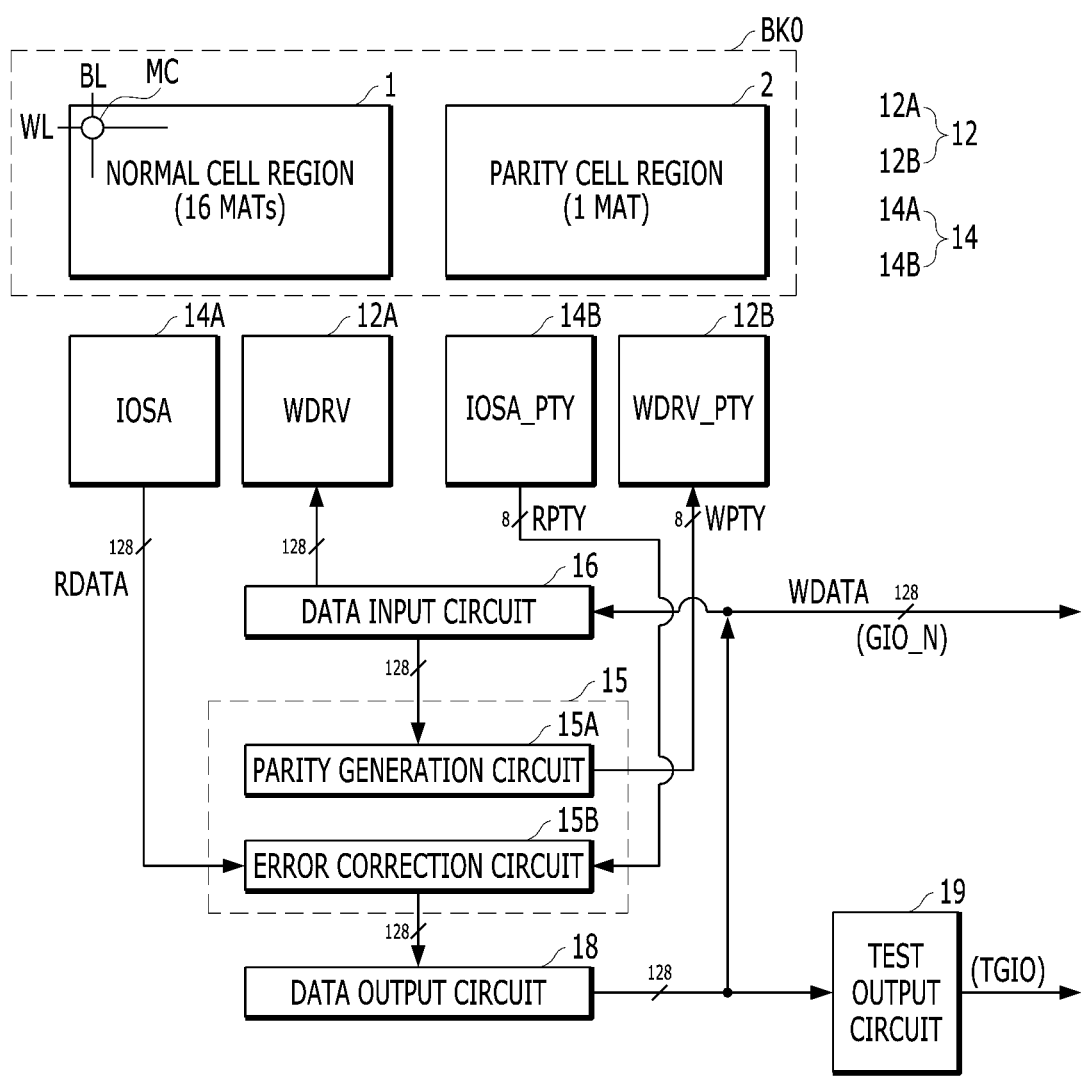

FIGS. 1 and 2 are diagrams illustrating a test operation of a memory device 10 adopting an on-chip ECC scheme. For clarity, FIGS. 1 and 2 mainly illustrate a column-side configuration in one bank BK0 of the memory device 10.

Referring to FIG. 1, the memory device 10 may include a normal cell region 1 for storing normal data and a parity cell region 2 for storing parity bits for correcting errors of the normal data. For example, a plurality of cell mats may be disposed in the normal cell region 1, and at least one cell mat may be disposed in the parity cell region 2. Bit line sense amplifier (BLSA) units corresponding to each of the cell mats may be disposed in the normal cell region 1 and the parity cell region 2. Hereinafter, by way of example, it is described that the normal cell region 1 is composed of 16 cell mats MAT1 to MAT16, and the parity cell region 2 is composed of one cell mat MAT_PTY.

The memory device 10 may further include a plurality of normal column decoders 3 and a parity column decoder 4. The normal column decoders 3 may be composed of 16 column decoders YDEC<0:15> corresponding to the 16 cell mats MAT1 to MAT16, respectively, and the parity column decoder 4 may be composed of one column decoder YDEC_PTY corresponding to the cell mat MAT_PTY.

Each of the plurality of normal column decoders YDEC<0:15> and the parity column decoder YDEC_PTY may decode a column address CA, and activate one of 128 column selection signals Yi<0:127> when a write command WT or a read command RD is activated. Each of the BLSA units may sense, amplify and output data loaded on bit lines BL according to an activated column selection signal Yi<X>, where X is an integer ranging from 0 to 127. A plurality of bit lines BL (for example, 8 bit lines BL), that is, memory cells MC, may be selected according to one column selection signal Yi<X>.

When the write command WT is inputted, a word line WL of all the cell mats MAT1 to MAT16 and MAT_PTY corresponding to a row address is activated, and the column selection signal Yi<X> corresponding to the column address CA is activated. Accordingly, in each of the cell mats, eight memory cells MC connected between the activated word line WL and the bit lines BL selected according to the activated column select signal Yi<X> may be selected. Since an 8-bit test pattern hold (TPH), for example, "10101010", is written to each of the 16 cell mats MAT1 to MAT16 of the normal cell region 1, the TPH having a total of 128 bits (=8*16) may be written to the normal cell region 1 according to one column selection signal Yi<X>. In addition, an 8-bit parity bit for correcting errors of the 128-bit TPH may be written to the cell mat MAT_PTY of the parity cell region 2.

Subsequently, when the read command RD is inputted, the word line WL of all the cell mats MAT1 to MAT16 and MAT_PTY corresponding to the row address is activated, and the column selection signal Yi<X> corresponding to the column address CA is activated. Accordingly, in each of the cell mats, eight memory cells MC connected between the activated word line WL and the selected bit lines BL may be selected. The memory device 10 may correct the errors of the 128-bit TPH read from the normal cell region 1 by using the parity bit read from the parity cell region 2, and compare the error-corrected TPH with a target test pattern, that is, "10101010", and output the comparison result as a 1-bit test result signal, which indicates pass or fail.

Referring to FIG. 2, the memory device 10 may include the normal cell region 1, the parity cell region 2, a write circuit 12, a read circuit 14, an error correction code (ECC) engine 15, a data input circuit 16, a data output circuit 18 and a test output circuit 19. The ECC engine 15 may include a parity generation circuit 15A and an error correction circuit 15B. The write circuit 12 may include a normal write circuit (WDRV) 12A and a parity write circuit (WDRV_PTY) 12B, and the read circuit 14 may include a normal read circuit (IOSA) 14A and a parity read circuit (IOSA_PTY) 14B. The normal cell region 1 and the parity cell region 2 may constitute one bank BK0.

The data input circuit 16 may receive and buffer write data WDATA inputted to a global data line GIO_N through a data pad (not illustrated), and transmit the buffered data to the normal write circuit 12A. The data input circuit 16 may be implemented as a repeater.

The parity generation circuit 15A may receive the write data WDATA transmitted from the data input circuit 16, and calculate write parity bits WPTY. The write parity bits WPTY may be data for correcting errors of the write data WDATA. Herein, it is exemplified that 8 write parity bits WPTY are generated for 128-bit write data WDATA.

The normal write circuit 12A may write the write data WDATA, which is transmitted from the data input circuit 16, to the normal cell region 1. The parity write circuit 12B may write the write parity bits WPTY, which are generated from the parity generation circuit 15A, to the parity cell region 2. The normal write circuit 12A and the parity write circuit 12B may be implemented as write drivers.

The normal read circuit 14A may sense and amplify read data RDATA outputted from the normal cell region 1. The parity read circuit 14B may sense and amplify read data outputted from the parity cell region 2, that is, read parity bits RPTY. The normal read circuit 14A and the parity read circuit 14B may be implemented as I/O sense amplifiers.

The error correction circuit 15B may correct errors of the read data RDATA, which is sensed and amplified by the normal read circuit 14A, by using the read parity bits RPTY, and output error-corrected data.

The data output circuit 18 may buffer the error-corrected data, and output the buffered data to the global data line GIO_N. The data output circuit 18 may be implemented as a repeater.

The test output circuit 19 may compare the error-corrected data loaded on the global data line GIO_N with a test pattern, and compress and output a 1-bit test result signal, which indicates pass or fail, to a test data line TGIO.

Although not illustrated in FIG. 2, the data input circuit 16, the parity generation circuit 15A, the normal write circuit 12A and the parity write circuit 12B may be activated during a write operation. For example, the data input circuit 16, the parity generation circuit 15A, the normal write circuit 12A and the parity write circuit 12B may be activated according to the write command WT. The normal read circuit 14A, the parity read circuit 14B, the error correction circuit 15B and the data output circuit 18 may be activated during a read operation. For example, the normal read circuit 14A, the parity read circuit 14B, the error correction circuit 15B and the data output circuit 18 may be activated according to the read command RD. The test output circuit 19 may be activated during a test read operation.

A parallel-bit test operation of the memory device 10 illustrated in FIGS. 1 and 2 is described as follows.

When the write command WT is inputted after a test mode is set, a test write operation is performed. The normal write circuit 12A may write the write data WDATA, for example, the 8-bit TPH of "10101010", which is transmitted from the data input circuit 16, to the 16 cell mats MAT1 to MAT16A of the normal cell region 1 in the same manner. The parity generation circuit 15A may receive the write data WDATA, and calculate the write parity bits WPTY. The parity write circuit 12B may write the write parity bits WPTY to the cell mat MAT_PTY of the parity cell region 2.

Subsequently, when the read command RD is inputted, the test read operation is performed. The normal read circuit 14A may sense and amplify the read data RDATA outputted from the normal cell region 1, and the parity read circuit 14B may sense and amplify the read parity bits RPTY outputted from the parity cell region 2. The error correction circuit 15B may correct the errors of the read data RDATA by using the read parity bits RPTY, and output the error-corrected data. The data output circuit 18 may output the error-corrected data to the global data line GIO_N. The test output circuit 19 may compare the error-corrected data with the test pattern, that is, "10101010", and compress and output the test result signal to the test data line TGIO.

As described above, during the test operation, the memory device 10 may write a specific test pattern to the normal cell region 1, read the test pattern, correct errors of the read test pattern by using the parity bits read from the parity cell region 2, compare the error-corrected test pattern with a target test pattern, and then determine whether the memory device 10 is defective or not, according to the comparison result. However, in a case of the memory device 10 adopting the on-chip ECC scheme, parity bits for correcting errors of normal cells are written to the parity cell region 2. Accordingly, it takes a lot of test time to perform the test operation of writing the same test data to the normal cell region 1 and the parity cell region 2 and then reading and comparing the test data.

Hereinafter, in the present disclosure, a method capable of reducing the test time by testing the parity generation circuit as well as the normal cell region and the parity cell region in the memory device adopting the on-chip ECC scheme is described.

Figure 3:
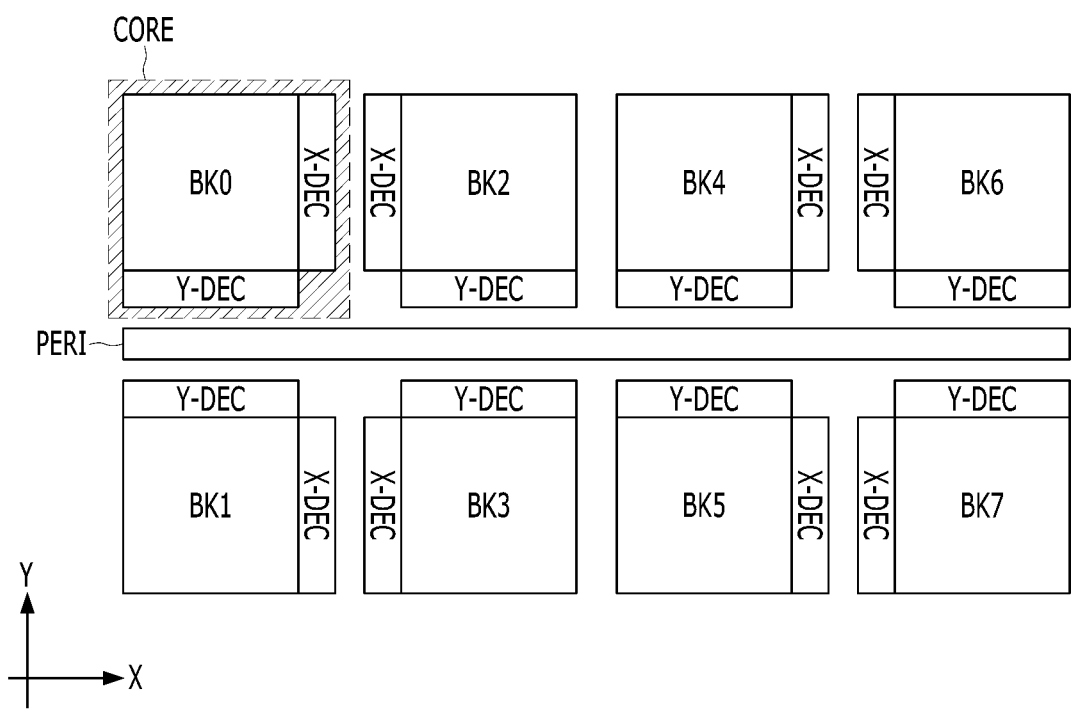
FIG. 3 is a diagram illustrating a bank structure of a memory device in accordance with an embodiment.

FIG. 3 is a diagram illustrating a bank structure of a memory device in accordance with an embodiment. Although FIG. 3 illustrates a case where eight banks are disposed in one memory device, the present disclosure is not limited thereto. Any suitable number of memory banks may be included in the memory device.

Referring to FIG. 3, first to eighth banks BK0 to BK7 are disposed in the memory device. The odd-numbered banks, that is, the first, third, fifth and seventh banks BK0, BK2, BK4 and BK6 may be disposed to be spaced apart in a row direction. The even-numbered banks, that is, the second, third, sixth and eighth banks BK1, BK3, BK5 and BK7 may be disposed to be spaced apart in the row direction. Each of bank pairs BK0 and BK1, BK2 and BK3, BK4 and BK5, as well as BK6 and BK7 may be disposed to be spaced apart in a column direction.

A row control circuit X-DEC for controlling a row operation, i.e., a word line control operation, of each of the banks may be disposed in the row direction of each of the banks BK0 to BK7, and a column control circuit Y-DEC for controlling a column operation, i.e., a bit line control operation, of each of the banks may be disposed in the column direction of each of the banks BK0 to BK7. For example, the row control circuits X-DEC may be disposed between the first bank BK0 and the third bank BK2, and the column control circuits Y-DEC may be disposed between the first bank BK0 and the second bank BK1. A row decoder (not illustrated) may be disposed in the row control circuit X-DEC, and the normal column decoder 3 and parity column decoder 4 illustrated in FIG. 1 and the write circuit 12 and read circuit 14 illustrated in FIG. 2 may be disposed in the column control circuit Y-DEC.

In the memory device, a region in which one bank and the row control circuit X-DEC and column control circuit Y-DEC corresponding to the bank are disposed may be defined as a "core region CORE", and a region between core regions CORE may be defined as a "peripheral region PERI". Circuits for controlling operations of the core regions CORE may be disposed in the peripheral region PERI. In other words, the ECC engine 15, data input circuit 16, data output circuit 18, test output circuit 19 and global data line GIO illustrated in FIG. 2 may be disposed in the peripheral region PERI.

Figure 4:
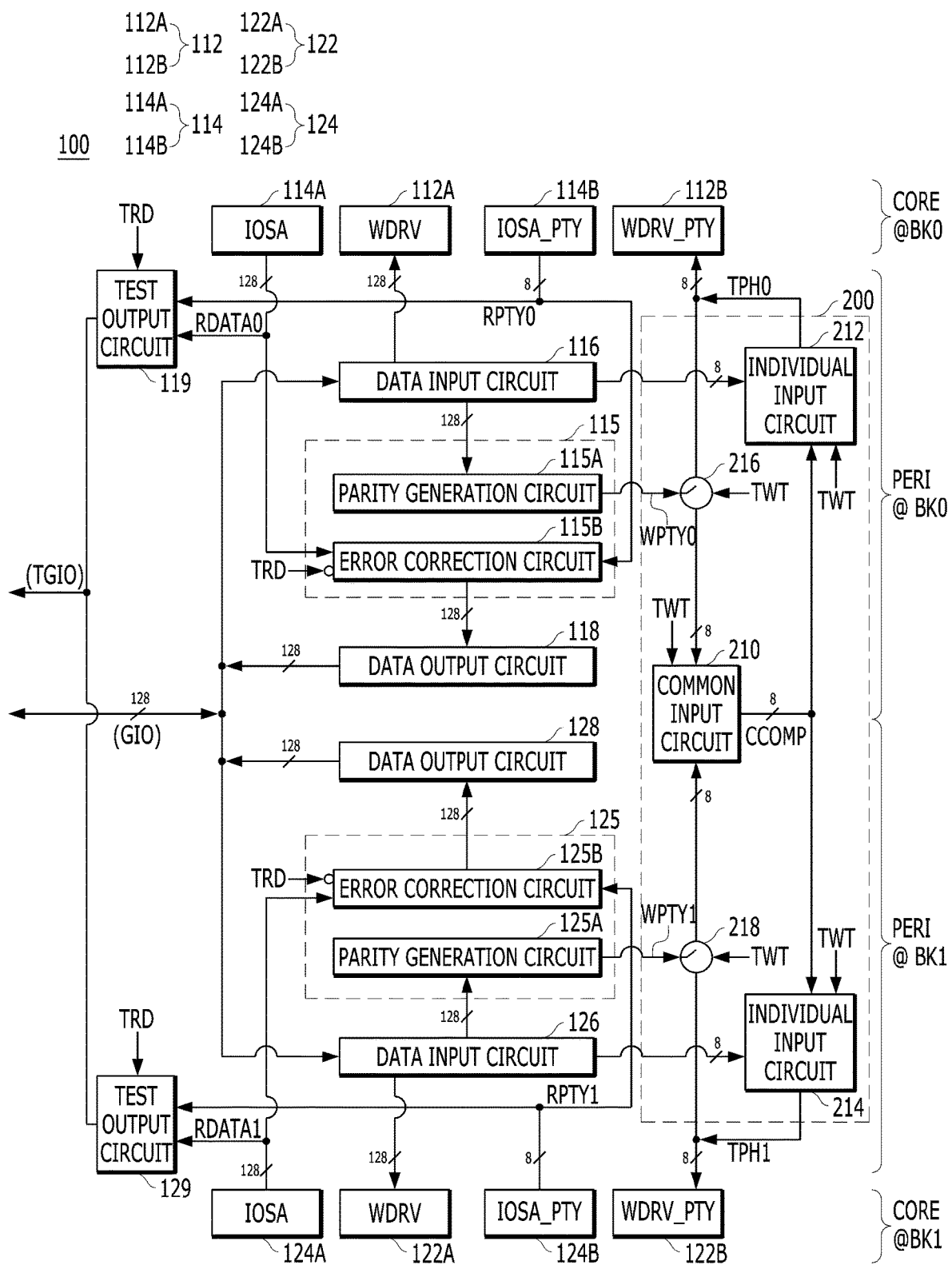
FIG. 4 is a block diagram illustrating a configuration of a memory device in accordance with an embodiment.

FIG. 4 is a block diagram illustrating a configuration of a memory device 100 in accordance with an embodiment.

FIG. 4 illustrates components disposed in a peripheral region PERI between a first bank BK0 and a second bank BK1 among a plurality of banks BK0 to BK7. Although normal cell regions and parity cell regions of the first and second banks BK0 and BK1 are not illustrated in FIG. 4, they may respectively correspond to the normal cell region 1 and the parity cell region 2 of the bank BK0 illustrated in FIG. 2.

Referring to FIG. 4, the memory device 100 may include a core region CORE@BK0 and a peripheral region PERI@BK0 on a first bank BK0 side and a core region CORE@BK1 and a peripheral region PERI@BK1 on a second bank BK1 side. Although the peripheral region PERI@BK0 on the first bank BK0 side and the peripheral region PERI@BK1 on the second bank BK1 side are illustrated separately in FIG. 4, the peripheral regions PERI@BK0 and PERI@BK1 may substantively constitute a single peripheral region PERI.

A normal cell region (reference numeral "1" of FIG. 2), a parity cell region (reference numeral "2" of FIG. 2), a write circuit 112 and a read circuit 114 may be disposed in the core region CORE@BK0, and an error correction code (ECC) engine 115, a data input circuit 116, a data output circuit 118 and a test output circuit 119 may be disposed in the peripheral region PERI@BK0. A normal cell region (reference numeral "1" of FIG. 2), a parity cell region (reference numeral "2" of FIG. 2), a write circuit 122 and a read circuit 124 may be disposed in the core region CORE@BK1, and an ECC engine 125, a data input circuit 126, a data output circuit 128 and a test output circuit 129 may be disposed in the peripheral region PERI@BK1.

In the present disclosure, the memory device 100 may further include a test input circuit 200 disposed in the peripheral region PERI. The test input circuit 200 may include a common input circuit 210, which is disposed in common in the peripheral regions PERI@BK0 and PERI@BK1, and individual input circuits 212 and 214, which are disposed in the peripheral regions PERI@BK0 and PERI@BK1, respectively. The test input circuit 200 may further include switches 216 and 218 disposed in the peripheral regions PERI@BK0 and PERI@BK1, respectively. Although FIG. 4 illustrates that the test input circuit 200 is disposed in common in the neighboring first and second banks BK0 and BK1 among the plurality of banks BK0 to BK7, the present disclosure is not limited thereto. In some embodiments, the test input circuit 200 may be disposed in common in more than two banks among the plurality of banks BK0 to BK7. In general, the test input circuit 200 may include a common input circuit, which is disposed in common in the at least two banks, and individual input circuits and switches, which are disposed in each of at least two banks.

The ECC engine 115 may include a parity generation circuit 115A and an error correction circuit 115B. The write circuit 112 may include a normal write circuit (WDRV) 112A and a parity write circuit (WDRV_PTY) 112B, and the read circuit 114 may include a normal read circuit (IOSA) 114A and a parity read circuit (IOSA_PTY) 114B. The ECC engine 125 may include a parity generation circuit 125A and an error correction circuit 125B. The write circuit 122 may include a normal write circuit (WDRV) 122A and a parity write circuit (WDRV_PTY) 122B, and the read circuit 124 may include a normal read circuit (IOSA) 124A and a parity read circuit (IOSA_PTY) 124B.

Hereinafter, since the configurations and operations of the circuits disposed in each of the core regions and peripheral regions are substantially the same, the circuits of the core region CORE@BK0 and peripheral region PERI@BK0 on the first bank BK0 side are described as an example. In addition, in order to faithfully describe the subject matter of the present disclosure, only control signals related to a test write operation and a test read operation, that is, a test write signal TWT and a test read signal TRD are illustrated in FIG. 4.

The data input circuit 116 may receive and buffer write data WDATA inputted to a global data line GIO through a data pad (not illustrated), and transmit the buffered data to the normal write circuit 112A, during a write operation. The data input circuit 116 may be implemented as a repeater. In addition, the data input circuit 116 may provide the normal write circuit 112A with 128-bit write data WDATA during the write operation. The data input circuit 116 may provide the test input circuit 200 with 8-bit write data WDATA written to one of 16 cell mats. The write operation may include a normal write operation and the test write operation.

The parity generation circuit 115A may receive the write data WDATA transmitted from the data input circuit 116, and calculate write parity bits WPTY0, during the write operation. The write parity bits WPTY0 may be data for correcting errors of the write data WDATA. 8 write parity bits WPTY0 may be generated for the 128-bit write data WDATA.

The common input circuit 210 of the test input circuit 200 may compare the 8 write parity bits WPTY0 of the first bank BK0 with the 8 write parity bits WPTY1 of the second bank BK1, and generate 8 common test bits CCOMP, during the test write operation. When each of the write parity bits WPTY0 of the first bank BK0 is the same as each of the write parity bits WPTY1 of the second bank BK1, the common input circuit 210 may output all the 8 bits of the common test bits CCOMP at a logic low level.

The individual input circuit 212 of the test input circuit 200 may compare the 8 bits of write data WDATA provided from the data input circuit 116 with the 8 common test bits CCOMP, and generate individual test bits TPH0 of the first bank BK0, during the test write operation. When the common test bits CCOMP are all at the logic low level, the individual input circuit 212 may provide the bits of the write data WDATA, provided from the data input circuit 116, as the individual test bits TPH0 of the first bank BK0.

The switch 216 of the test input circuit 200 may provide one of the common input circuit 210 and the parity write circuit 112B with the write parity bits WPTY0 of the first bank BK0. The switch 216 may provide the parity write circuit 112B with the write parity bits WPTY0 of the first bank BK0 during the normal write operation, and provide the common input circuit 210 with the write parity bits WPTY0 of the first bank BK0 during the test write operation. The common input circuit 210, individual input circuit 212 and switch 216 of the test input circuit 200 may be activated in response to the test write signal TWT activated during the test write operation.

The normal write circuit 112A may write the 128-bit write data WDATA, which is transmitted from the data input circuit 116, to the normal cell region 1 during the write operation. By the normal write circuit 112A, the 128-bit write data WDATA may be written by 8 bits to each of the 16 cell mats of the normal cell region 1 during the normal write operation, and a 8-bit test pattern hold (TPH) may be written to the 16 cell mats of the normal cell region 1 in the same manner during the test write operation. The parity write circuit 112B may write the write parity bits WPTY0 generated from the parity generation circuit 115A or the individual test bits TPH0 provided from the individual input circuit 212 to the parity cell region 2 during the write operation. By the parity write circuit 112B, the 8 write parity bits WPTY0 may be written to the parity cell region 2 during the normal write operation, and the 8 individual test bits TPH0 may be written to the parity cell region 2 during the test write operation. The normal write circuit 112A and the parity write circuit 112B may be implemented as write drivers.

The normal read circuit 114A may sense and amplify 128-bit read data RDATA0 outputted from the normal cell region 1, during a read operation. The parity read circuit 114B may sense and amplify read data outputted from the parity cell region 2, that is, 8 read parity bits RPTY0, during the read operation. The normal read circuit 114A and the parity read circuit 114B may be implemented as I/O sense amplifiers. The read operation may include a normal read operation and the test read operation.

The error correction circuit 115B, which is activated during the normal read operation, may correct errors of the read data RDATA0, which is sensed and amplified by the normal read circuit 114A, by using the read parity bits RPTY0, and output 128-bit error-corrected data. In the present disclosure, the error correction circuit 115B is deactivated during the test read operation, and does not perform an error correction operation. The error correction circuit 115B may be deactivated in response to the test read signal TRD activated during the test read operation.

The data output circuit 118 may buffer the error-corrected data, and output the buffered data to the global data line GIO, during the normal read operation. The data output circuit 118 may be implemented as a repeater.

During the test read operation, the test output circuit 119 may compare the read data RDATA0 outputted from the normal read circuit 114A with the read parity bits RPTY0 corresponding to the individual test bits TPH0, outputted from the parity read circuit 114B, and compress and output a 1-bit test result signal, which indicates pass or fail, to a test data line TGIO. The test output circuit 119 may output the 1-bit test result signal to the test data line TGIO by performing an XOR operation on the 128-bit read data RDATA0 and the 8 read parity bits RPTY0 according to the test read signal TRD.

Figure 5:
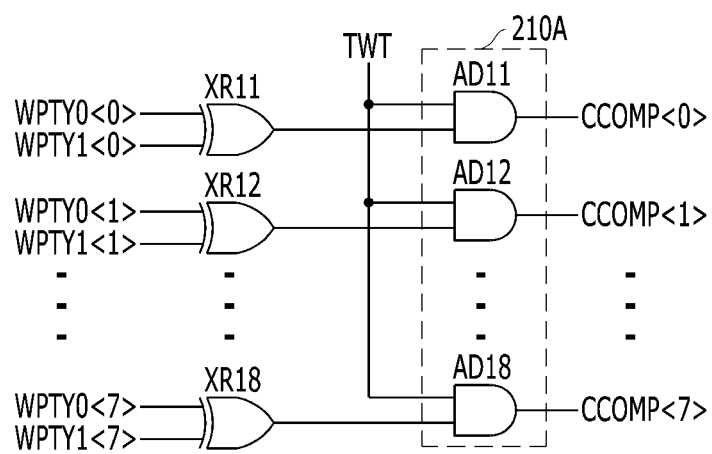
FIG. 5 is a circuit diagram illustrating a detailed configuration of a common input circuit, such as that illustrated in FIG. 4.

FIG. 5 is a circuit diagram illustrating a detailed configuration of the common input circuit 210 illustrated in FIG. 4.

Referring to FIG. 5, the common input circuit 210 may include first to eighth logic units XR11 to XR18 and an output unit 210A.

The first to eighth logic units XR11 to XR18 may correspond to the write parity bits WPTY0<0:7>, respectively. The first to eighth logic units XR11 to XR18 may perform the XOR operations on the write parity bits WPTY0<0:7> of the first bank BK0 and the write parity bits WPTY1<0:7> of the second bank BK1, respectively. For example, the first logic unit XR11 may perform the XOR operation on the first write parity bit WTPY0<0> of the first bank BK0 and the first write parity bit WPTY1<0> of the second bank BK1. Preferably, each of the first to eighth logic units XR11 to XR18 is implemented as an XOR gate.

The output unit 210A may perform a logical, e.g., AND, operation on the output of each of the first to eighth logic units XR11 to XR18 with the test write signal TWT to generate output signals represented by the bits CCOMP<0:7>. When the test write signal TWT is activated at a logic high level, the output unit 210A may output the output signals of the first to eighth logic units XR11 to XR18 as the common test bits CCOMP. For example, the output unit 210A may be implemented as first to eighth AND gates AD11 to AD18 that correspond to the first to eighth logic units XR11 to XR18, respectively, and perform AND operations on the test write signal TWT and the output signals of the first to eighth logic units XR11 to XR18, respectively.

With the above-described configurations, the common input circuit 210 may output the common test bits CCOMP of "00000000" when the sequence of write parity bits WPTY0 of the first bank BK0 (WPTY0<0:7>) is the same as the sequence of the write parity bits WPTY1 of the second bank BK1 (WPTY1<0:7>) during the test write operation. That is, the corresponding bits of WPTY0<0:7> and WPTY1<0:7> are compared.

Figure 6:
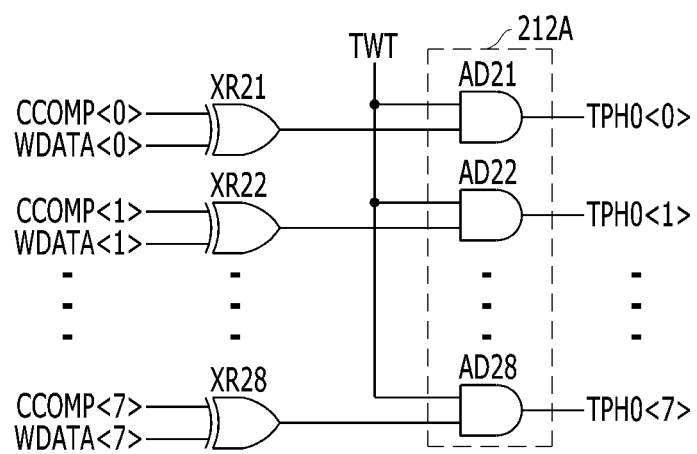
FIG. 6 is a circuit diagram illustrating a detailed configuration of an individual input circuit, such as that illustrated in FIG. 4.

FIG. 6 is a circuit diagram illustrating a detailed configuration of the individual input circuit 212 illustrated in FIG. 4.

Referring to FIG. 6, the individual input circuit 212 may include first to eighth logic units XR21 to XR28 and an output unit 212A. The first to eighth logic units XR21 to XR28 may correspond to the bits CCOMP<0:7> of the common test bits CCOMP, respectively. The first to eighth logic units XR21 to XR28 may perform the XOR operations on specific bits of the write data WDATA and the common test bits CCOMP. The specific bits, which may be predetermined, may be some bits of the write data WDATA, for example, WDATA<0:7>, and be composed of the same bits as the 8-bit TPH written to one of the 16 cell mats during the test write operation. For example, the first logic unit XR21 may perform the XOR operation on the first common test bit CCOMP<0> and the first bit of the 8-bit TPH. Preferably, each of the first to eighth logic units XR21 to XR28 is implemented as an XOR gate.

The output unit 212A may output signals output from the first to eighth logic units XR21 to XR28 as the individual test bits TPH0 of the first bank BK0 according to the test write signal TWT. When the test write signal TWT is activated at the logic high level, the output unit 212A may output the signals output from the first to eighth logic units XR21 to XR28 as the bits THP0<0:7> of the individual test bits TPH0, respectively. For example, the output unit 212A may be implemented as first to eighth AND gates AD21 to AD28 that correspond to the first to eighth logic units XR21 to XR28, respectively, and perform the AND operations on the test write signal TWT and the output signals of the first to eighth logic units XR21 to XR28, respectively.

With the above-described configurations, the individual input circuit 212 may output the individual test bits TPH0 composed of the same bits as the 8-bit TPH written to one of the 16 cell mats when the common test bits CCOMP of "00000000" are inputted during the test write operation.

Hereinafter, the normal operation of the memory device in accordance with an embodiment is described with reference to FIGS. 4 to 7, 8A and 8B.

Figure 7:
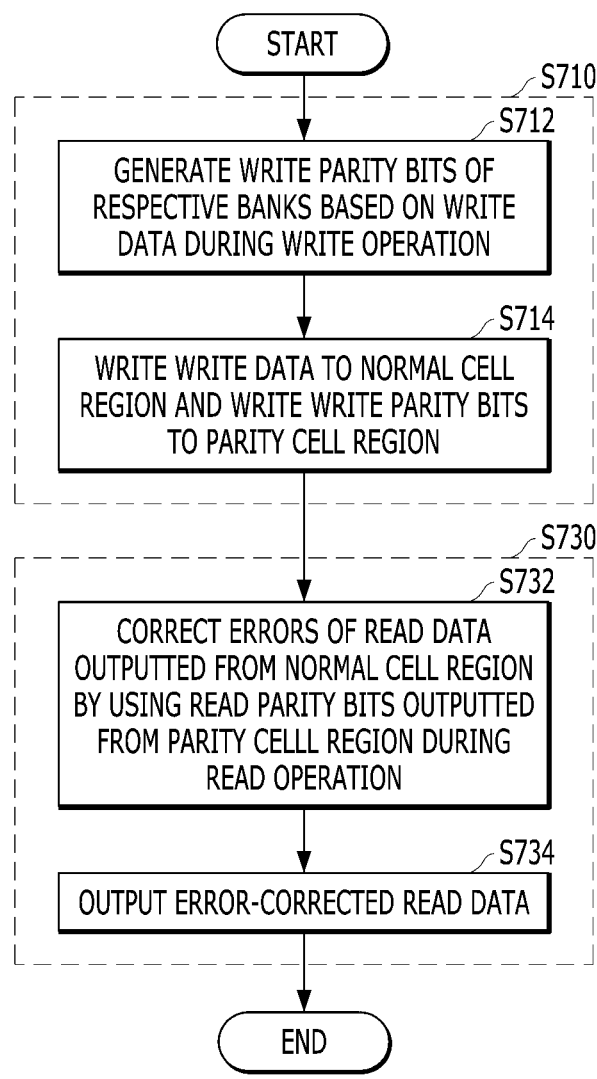
FIG. 7 is a flowchart illustrating a normal operation of a memory device, such as that illustrated in FIG. 4.
Figure 8A:
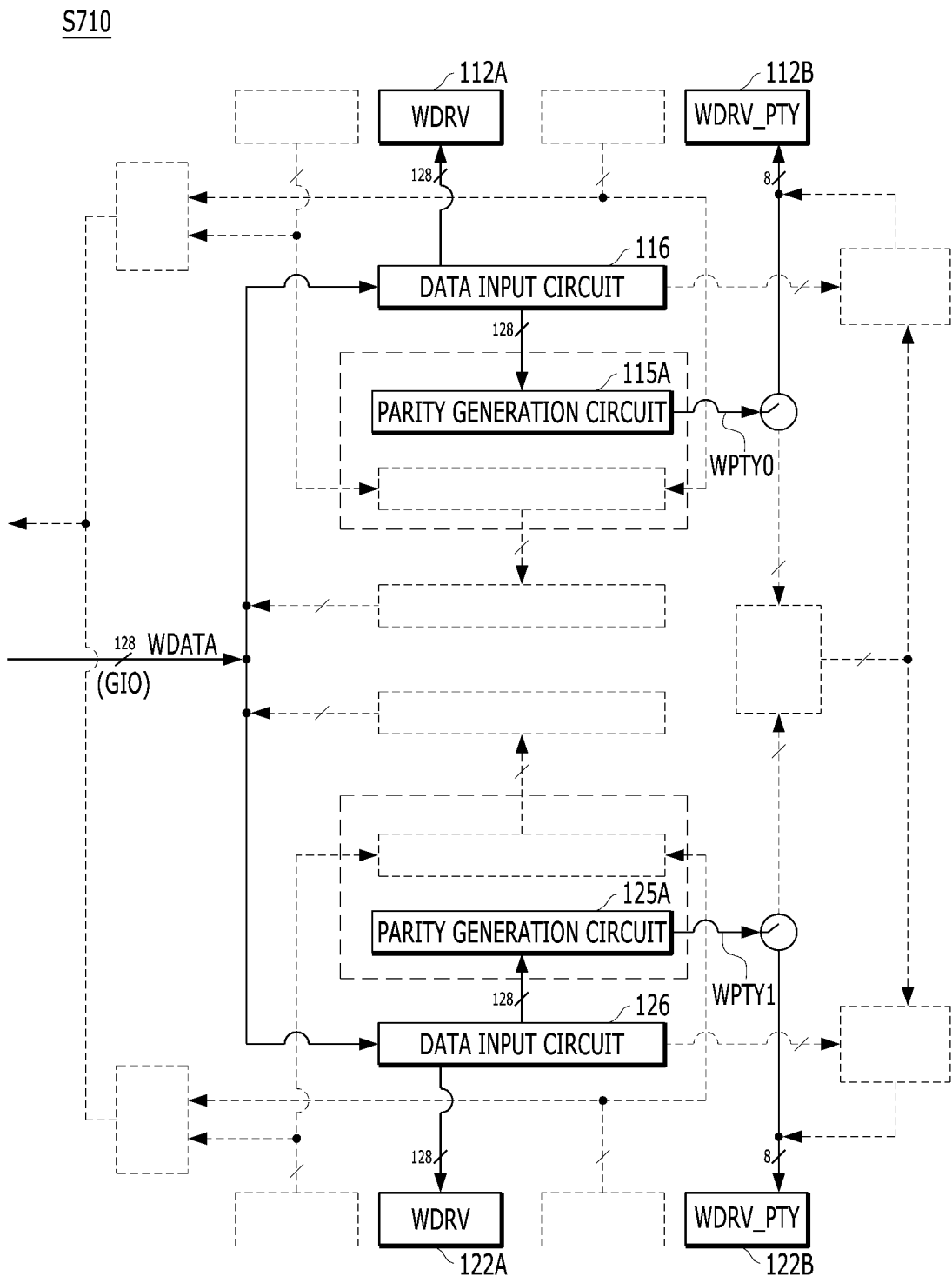
FIGS. 8A and 8B are diagrams illustrating a normal write operation and a normal read operation, such as that illustrated in FIG. 7.
Figure 8B:
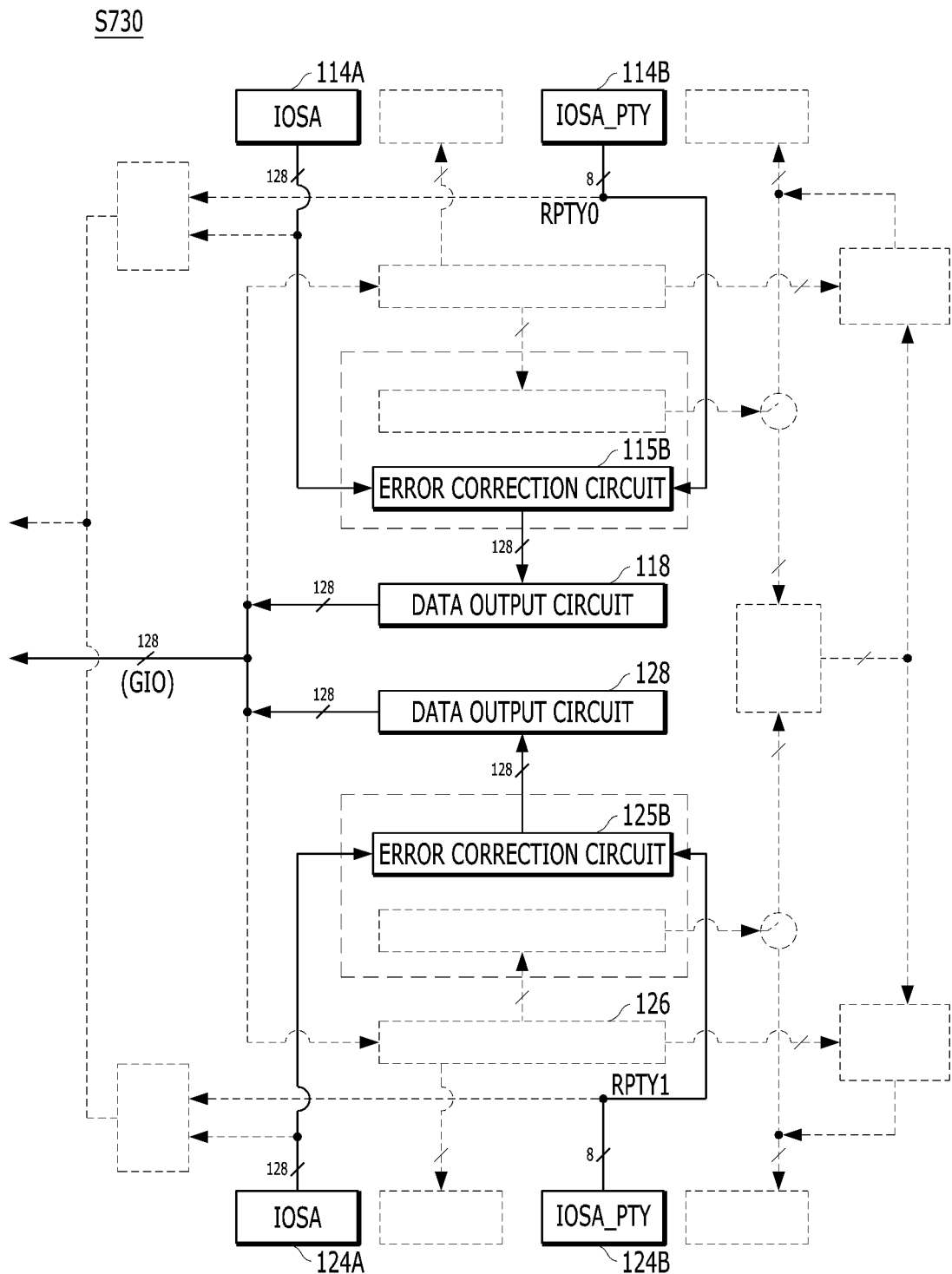

FIG. 7 is a flowchart 700 illustrating the normal operation of the memory device 100 illustrated in FIG. 4. FIGS. 8A and 8B are diagrams to help understand the normal write operation and the normal read operation illustrated in FIG. 7. For reference, the circuits disposed in the peripheral region PERI@BK0 of the first bank BK0 or the circuits disposed in the peripheral region PERI@BK1 of the second bank BK1 may operate at different timings according to a bank selection signal or a bank enable signal.

Referring to FIGS. 7 and 8A, when the write command WT is inputted, the normal write operation is performed in step S710. The data input circuits 116 and 126 of the respective banks receive the write data WDATA inputted to the global data line GIO. The parity generation circuits 115A and 125A receive the write data WDATA transmitted from the data input circuits 116 and 126, and generate the write parity bits WPTY0 and WPTY1 of the respective banks, in step S712.

Since the test write signal TWT is deactivated, the switch 216 of the first bank BK0 may provide the parity write circuit 112B with the write parity bits WPTY0 of the first bank BK0, and the switch 218 of the second bank BK1 may provide the parity write circuit 122B with the write parity bits WPTY1 of the second bank BK1. The normal write circuits 112A and 122A may write the 128-bit write data WDATA, transmitted from the data input circuits 116 and 126, to the normal cell region 1. The parity write circuits 112B and 122B may write the write parity bits WPTY0 and the write parity bits WPTY1, generated from the parity generation circuits 115A and 125A, to the parity cell region 2, in step S714.

Referring to FIGS. 7 and 8B, when the read command RD is inputted, the normal read operation is performed in step S730. The normal read circuits 114A and 124A sense and amplify the read data RDATA0 and RDATA1 outputted from the normal cell region 1, and the parity read circuits 114B and 124B sense and amplify the read parity bits RPTY0 and RPTY1 outputted from the parity cell region 2. The error correction circuits 115B and 125B correct the errors of the read data RDATA0 by using the read parity bits RPTY0, and output the error-corrected data, in step S732. The data output circuit 118 may buffer the error-corrected data, and output the buffered data to the global data line GIO, in step S734.

Figure 9:
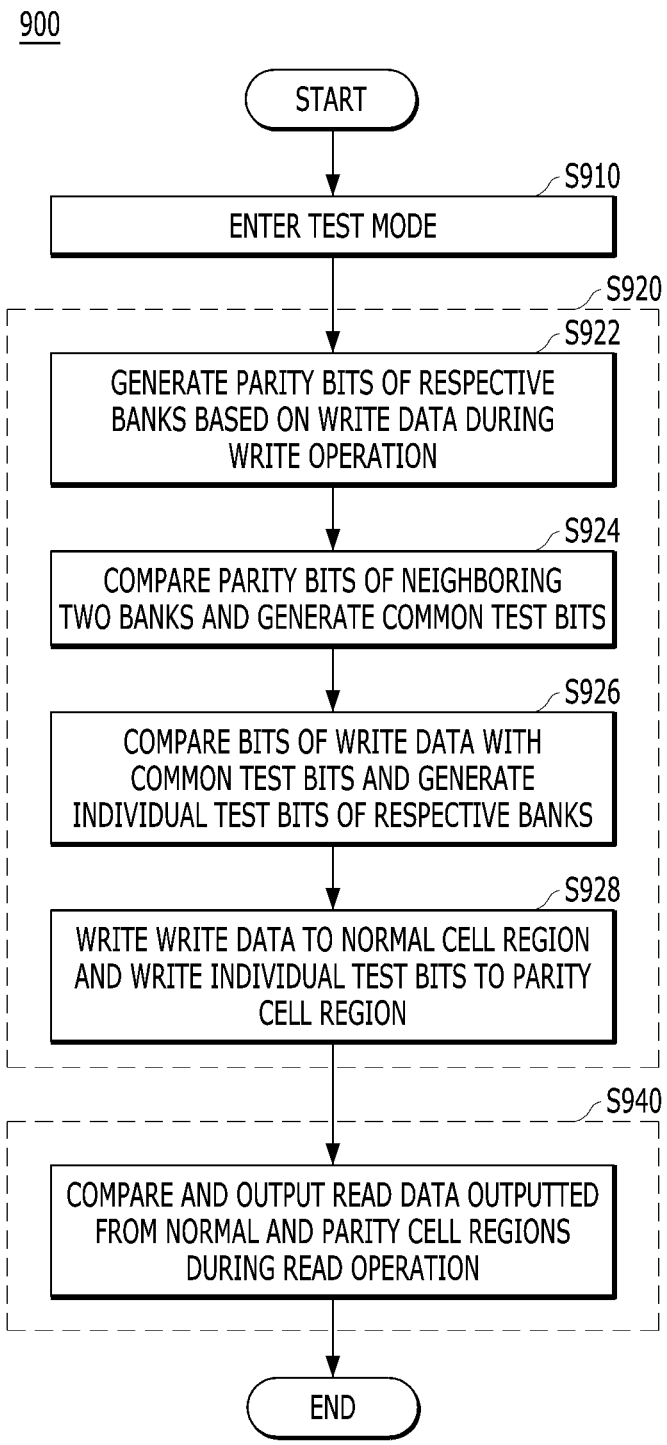
FIG. 9 is a flowchart illustrating a test operation of a memory device, such as that illustrated in FIG. 4.
Figure 10A:
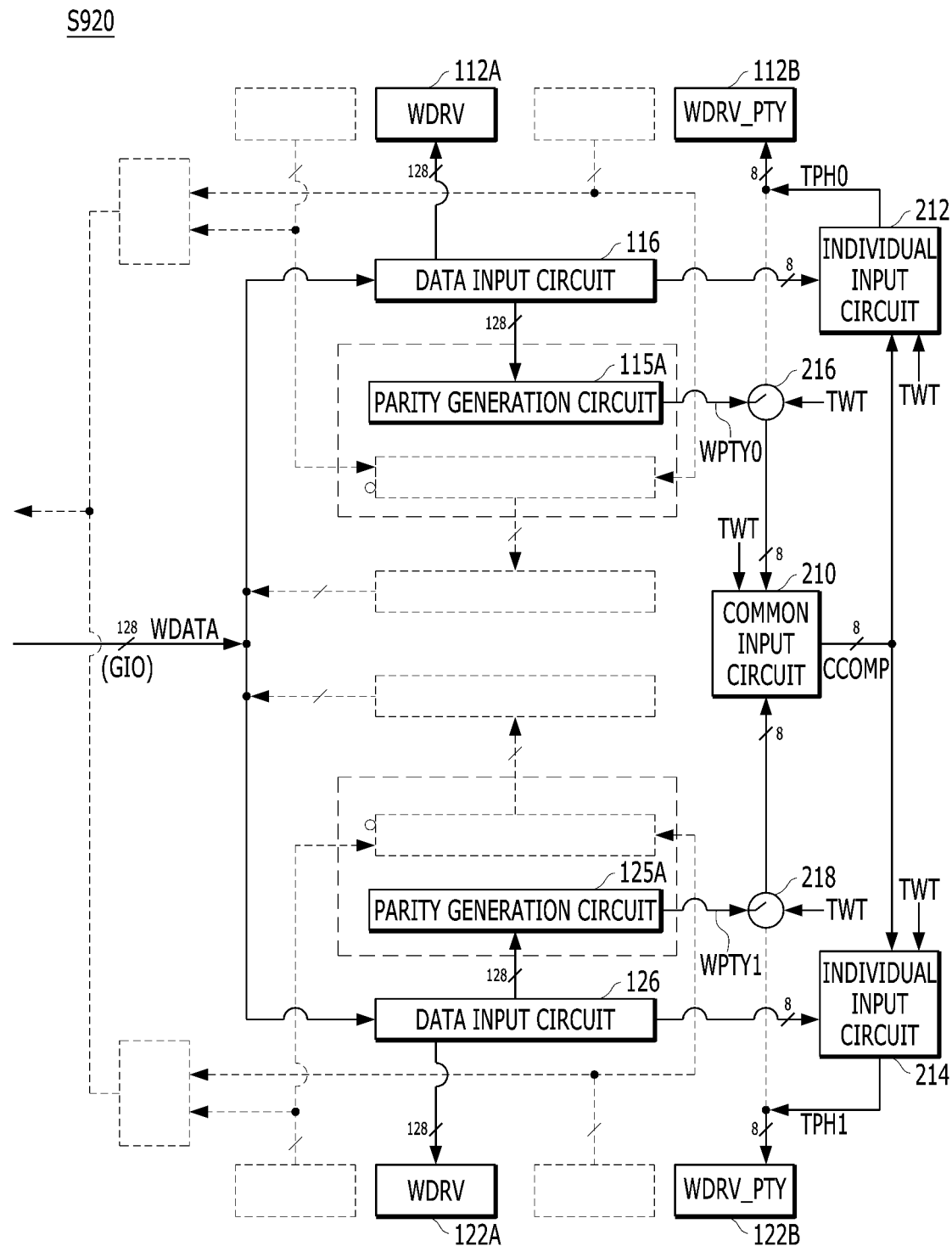
FIGS. 10A and 10B are diagrams illustrating a test write operation and a test read operation of a memory device, such as that illustrated in FIG. 9.
Figure 10B:
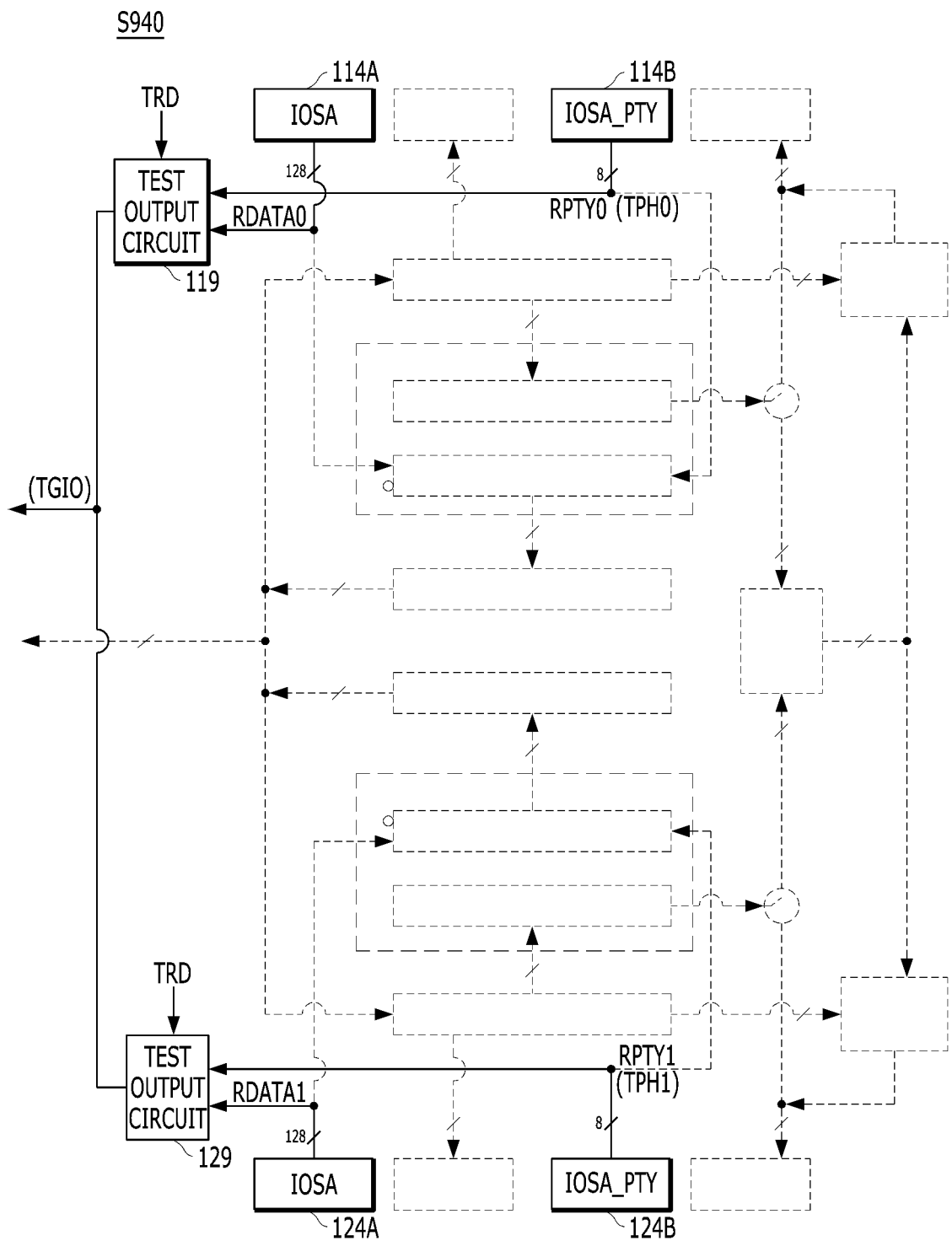

FIG. 9 is a flowchart 900 illustrating the test operation of the memory device 100 illustrated in FIG. 4. FIGS. 10A and 10B are diagrams to help understand the test write operation and the test read operation illustrated in FIG. 9.

Referring to FIGS. 9 and 10A, when the write command WT is inputted after the memory device 100 enters the test mode in step S910, the test write signal TWT is activated, and the test write operation is performed, in step S920. The data input circuits 116 and 126 of the respective banks receive the write data WDATA inputted to the global data line GIO. The parity generation circuits 115A and 125A receive the write data WDATA transmitted from the data input circuits 116 and 126, and generate the write parity bits WPTY0 and WPTY1 of the respective banks, in step S922.

Since the test write signal TWT is activated, the switches 216 and 218 provide the common input circuit 210 with the write parity bits WPTY0 and WPTY1. The common input circuit 210 compares the write parity bits WPTY0 and WPTY1 of the first and second banks BK0 and BK1, and generates the common test bits CCOMP, in step S924. The common input circuit 210 may output the common test bits CCOMP of "00000000" when the write parity bits WPTY0 of the first bank BK0 are the same as the write parity bits WPTY1 of the second bank BK1, respectively. On the other hand, when even one pair of bits of WPTY0 and WPTY1 are different due to malfunction of either of the parity generation circuits 115A and 125A, one of the common test bits CCOMP has a logic high level.

The individual input circuit 212 may compare the bits of the write data WDATA, provided from the data input circuit 116, with the common test bits CCOMP, and generate the individual test bits TPH0 of the first bank BK0, in step S926. Similarly, the individual input circuit 214 may compare the bits of the write data WDATA, provided from the data input circuit 126, with the common test bits CCOMP, and generate the individual test bits TPH1 of the second bank BK1. When the common test bits CCOMP of "00000000" are inputted, the individual input circuits 212 and 214 may output the individual test bits TPH0 and TPH1 composed of the same bits as the 8-bit test pattern hold (TPH) written to one of the 16 cell mats. On the other hand, when any one of the common test bits CCOMP having a high bit is inputted, the individual input circuits 212 and 214 may output the individual test bits TPH0 and TPH1 composed of different bits from the test pattern hold (TPH).

The normal write circuits 112A and 122A may write the 128-bit write data WDATA, transmitted from the data input circuits 116 and 126, to the normal cell region 1. For example, the normal write circuits 112A and 122A may write the 8-bit TPH of "10101010" to the 16 cell mats MAT1 to MAT16 of the normal cell region 1 in the same manner. The parity write circuits 112B and 122B may write the individual test bits TPH0 and TPH1 to the parity cell region 2, in step S928.

Referring to FIGS. 9 and 10B, when the read command RD is inputted, the test read signal TRD is activated, and the test read operation is performed, in step S940. The normal read circuits 114A and 124A sense and amplify the read data RDATA0 and RDATA1 outputted from the normal cell region 1, and the parity read circuits 114B and 124B sense and amplify the read parity bits RPTY0 and RPTY, i.e., the individual test bits TPH0 and TPH1 outputted from the parity cell region 2. The error correction circuits 115B and 125B are deactivated during the test read operation, and thus do not perform the error correction operation.

The test output circuit 119 may perform the XOR operation on the 128-bit read data RDATA0 and the 8-bit read parity bits RPTY0, and output the 1-bit test result signal to the test data line TGIO. Similarly, the test output circuit 129 may perform the XOR operation on the 128-bit read data RDATA1 and the 8-bit read parity bits RPTY1, and output the 1-bit test result signal to the test data line TGIO. According to an embodiment, the test output circuits 119 and 129 may be controlled to operate at different timings.

When malfunction of the parity generation circuits 115A and 125A occurs, the 8-bit test pattern hold (TPH) of "10101010" is written to the 16 cell mats MAT1 to MAT16 of the normal cell region 1 without any error and the individual test bits TPH0 and TPH1 respectively composed of one or more erroneous bits with respect to the 8-bit test pattern hold (TPH) are written to the parity cell region 2. Accordingly, the test result signal generated by performing the XOR operation on the read data RDATA0 and the read individual test bits TPH0 may have the logic high level. Alternatively, when a defect occurs in the normal cell region 1 and the parity cell region 2 even though the parity generation circuits 115A and 125A operate normally, the test result signal may have the logic high level. An external test device or a controller may identify, based on the test result signal, an error or a defect in any among the parity generation circuits 115A and 125A, the normal cell region 1 and the parity cell region 2.

As described above, in the present disclosure, a memory device adopting the on-chip ECC scheme may write the same pattern to normal and parity cell regions, and then compare and compress the written pattern during the test operation, thereby reducing the time required to perform a parallel-bit test operation. In addition, in the present disclosure, the parity generation circuit as well as the normal and parity cell regions may be tested, thereby further reducing the test time.

In accordance with embodiments, a memory device adopting the on-chip ECC scheme may test a normal cell region and a parity cell region together, thereby reducing the test time.

In addition, in accordance with embodiments, a memory device adopting the on-chip ECC scheme may test a parity generation circuit as well as normal and parity cell regions, thereby reducing the test time.

While the present disclosure has been illustrated and described with respect to specific embodiments, the disclosed embodiments are not intended to be restrictive. Further, it is noted that the present invention may be achieved in various ways through substitution, change, and modification that fall within the scope of the following claims, as those skilled in the art will recognize in light of the present disclosure.

For example, dispositions and types of logic gates and transistors described in the aforementioned embodiments may be implemented differently based on the polarity of the inputted signal.

What is claimed is:

1. A memory device comprising:
a plurality of banks, each including a normal cell region and a parity cell region;
a plurality of parity generation circuits, each configured to generate parity bits for write data to be stored in the normal cell region within a corresponding bank of the plurality of banks;
a test input circuit disposed in common in at least two of the banks, and configured to generate common test bits by comparing the parity bits of the at least two of the banks, and generate individual test bits for each of the banks by comparing bits of the write data with the common test bits;
a plurality of write circuits, each configured to write the write data to the normal cell region within the corresponding bank and write the individual test bits to the parity cell region within the corresponding bank; and
a plurality of test output circuits, each configured to compare data read from the normal cell region with the individual test bits read from the parity cell region within the corresponding bank.

2. The memory device of claim 1, wherein each of the write circuits includes:
a normal write circuit configured to write the write data to the normal cell region within the corresponding bank; and
a parity write circuit configured to write the individual test bits to the parity cell region within the corresponding bank.

3. The memory device of claim 1, wherein the test input circuit includes:
a common input circuit configured to generate the common test bits by comparing the parity bits of the at least two of the banks according to a test write signal; and
a plurality of individual input circuits corresponding to the plurality of banks, respectively, and configured to generate the individual test bits of the corresponding bank by comparing the bits of the write data with the common test bits.

4. The memory device of claim 3, wherein the common input circuit includes:
a plurality of first logic circuits, each configured to perform an XOR operation in a bitwise manner on the parity bits of two of the plurality of banks; and
a first output circuit configured to output output signals of the first logic circuits as the common test bits.

5. The memory device of claim 3, wherein each of the individual input circuits includes:
a plurality of second logic circuits configured to perform XOR operations on the bits of the write data and the common test bits; and
a second output circuit configured to output output signals of the second logic circuits as the individual test bits.

6. The memory device of claim 3, wherein the test input circuit further includes a plurality of switches that provide the common input circuit with the parity bits corresponding to the at least two of the banks.

7. The memory device of claim 1, wherein each of the test output circuits performs an XOR operation on bits of the data read from the normal cell region with the individual test bits read from the parity cell region within the corresponding bank and outputs an operation result as a test result signal.

8. A test method of a memory device, comprising:
generating parity bits for write data to be stored in a normal cell region within each of a plurality of banks;
generating common test bits by comparing the parity bits of at least two of the banks, and generating individual test bits for each of the banks by comparing bits of the write data with the common test bits;
writing the write data to the normal cell region and writing the individual test bits to a parity cell region within a corresponding bank; and
comparing data read from the normal cell region with the individual test bits read from the parity cell region within the corresponding bank.

9. The test method of claim 8, wherein the generating of the common test bits includes generating the common test bits by performing an XOR operation in a bitwise manner on the parity bits of two of the plurality of banks.

10. The test method of claim 8, wherein the generating of the individual test bits includes generating the individual test bits by performing an XOR operation on the bits of the write data and the common test bits.

11. The test method of claim 8, wherein the comparing of the read data includes outputting a test result signal by performing an XOR operation on bits of the data read from the normal cell region with the individual test bits read from the parity cell region within the corresponding bank.

12. A memory device comprising:
a plurality of banks, each including a normal cell region and a parity cell region;
a plurality of parity generation circuits, each configured to generate parity bits for write data to be stored in the normal cell region within the corresponding bank;
a common input circuit disposed in common in at least two of the banks, and configured to generate common test bits by comparing the parity bits of the at least two of the banks;
a plurality of individual input circuits, each configured to generate individual test bits for each of the banks by comparing bits of the write data with the common test bits; and
a plurality of write circuits, each configured to write the write data to the normal cell region and writing the individual test bits to the parity cell region within the corresponding bank.

13. The memory device of claim 12, wherein the common input circuit includes:
a plurality of first logic circuits, each configured to perform an XOR operation in a bitwise manner on the parity bits of two of the plurality of banks; and
a first output circuit configured to output output signals of the first logic circuits as the common test bits.

14. The memory device of claim 12, wherein each of the individual input circuits includes:
a plurality of second logic circuits configured to perform XOR operations on the bits of the write data and the common test bits; and
a second output circuit configured to output output signals of the second logic circuits as the individual test bits.

15. The memory device of claim 12, further comprising a plurality of test output circuits each configured to compare data read from the normal cell region with the individual test bits read from the parity cell region within the corresponding bank.

16. The memory device of claim 15, wherein each of the test output circuits performs an XOR operation on bits of the data read from the normal cell region with the individual test bits read from the parity cell region within the corresponding bank and outputs an operation result as a test result signal.

* * * * *